(12) United States Patent
Kim

(10) Patent No.: US 6,479,328 B1
(45) Date of Patent: Nov. 12, 2002

(54) METHOD OF FABRICATING SOI WAFER

(75) Inventor: Hyung Ki Kim, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 19 days.

(21) Appl. No.: 09/705,873

(22) Filed: Nov. 6, 2000

(30) Foreign Application Priority Data

Nov. 4, 1999 (KR) .......................................... 99-48666

(51) Int. Cl.$^7$ ............................................... H01L 21/00
(52) U.S. Cl. ........................ 438/149; 438/155; 257/347
(58) Field of Search ................................ 438/149, 766, 438/455, 460, 506, 406, 424, 410

(56) References Cited

U.S. PATENT DOCUMENTS 5,416,041 A * 5/1995 Schwalke .................... 438/404
6,207,532 B1 * 3/2001 Lin et al. .................... 438/424

* cited by examiner

Primary Examiner—Wael Fahmy
Assistant Examiner—William David Coleman
(74) Attorney, Agent, or Firm—Pillsbury Winthrop LLP

(57) ABSTRACT

The present invention discloses a method for fabricating a SOI wafer. The method for fabricating the SOI wafer of the present invention, comprising the steps of: preparing a semiconductor substrate and a base substrate; forming a pad oxide layer, a nitride layer and a mask oxide layer in sequence on one surface of the semiconductor substrate; etching the pad oxide layer, the nitride layer, and the mask oxide layer to expose an isolation region of the semiconductor substrate; forming a trench by etching the exposed semiconductor substrate region; removing the mask oxide layer; forming a field oxide layer having bird's-beak at the edge thereof by oxidizing the low surface of the trench; removing the field oxide layer; forming an isolation layer of trench type to fill the oxide layer into the trench; removing the nitride layer and the pad oxide layer; depositing a first insulating layer on the isolation layer and the semiconductor substrate; depositing a second insulating layer on the base substrate; bonding the semiconductor substrate and the base substrate to form a contact of the first insulating layer with the second insulating layer; polishing the surface of the semiconductor substrate using the isolation layer as a polishing stopper; and further polishing the surface of the semiconductor substrate to expose the bird's beak and to form a semiconductor layer of a desired thickness.

7 Claims, 6 Drawing Sheets

METHOD OF FABRICATING SOI WAFER

BACKGROUND OF THE INVENTION

1. Field of the Invention

The present invention relates to a method of fabricating a Silicon-On-Insulator (SOI) wafer, and more particularly to a method of fabricating a SOI wafer capable of providing good device characteristics.

2. Description of the Related Art

With the development of high integration and high performance semiconductor devices, a semiconductor integration technology using a SOI wafer instead of a single crystal Si wafer comprised of a bulk silicon has proven to be attractive. This is because the semiconductor device integrated in the SOI wafer offers advantages in high speed driving due to low junction capacitance, low voltage driving due to low threshold voltage and decreased latch-up due to more complete device isolation, when compared to single crystal Si wafer integrated technology.

The SOI wafer has a stack structure of a base substrate as supporting means, a buried oxide layer as a bonding medium disposed on the base substrate and a semiconductor layer for providing a device formation region which is disposed on the buried oxide layer. The two main methods of forming a SOI wafer are the implanted oxygen (SIMOX) method and the bonding method.

The SIMOX method fabricates a SOI wafer comprising a stack structure of a base substrate, a buried oxide layer and a semiconductor layer. The semiconductor layer is produced by implanting oxygen ions into a Si wafer at a selected depth from the surface of the Si wafer. During a subsequent heat treatment the implanted oxygen reacts with the Si to form a layer of silicon dioxide that separated the base substrate and the semiconductor layer.

The prior art bonding method fabricates a SOI wafer having a similar stack structure comprising a base substrate, a buried oxide layer and a semiconductor layer by bonding two Si substrates, for example, the base substrate and a semiconductor substrate with interleaving the oxide layer and polishing a partial thickness of the back face of the semiconductor substrate so as to form a semiconductor layer.

However, the SIMOX method, requiring both an ion implantation step and a subsequent heat treatment step, makes it difficult to control the thickness of the semiconductor layer and takes a relatively long time for process. Using the bonding method to fabricate a SOI wafer is relatively simple, but it is still difficult to obtain a semiconductor layer of a desired thickness because there is no polishing stopper layer available for use during the polishing process to form a consistent and uniform semiconductor layer.

Recently, a variation of the bonding method having a trench type isolation layer functioning as a polishing stopper during the CMP process on the semiconductor substrate. The planarized semiconductor substrate is then bonded to the base substrate to form a SOI wafer.

Hereinafter, a method of fabricating a SOI wafer according to the prior art will be described with reference to FIGS. 1A and 1B.

FIG. 1A shows a semiconductor substrate 1a comprising bulk single crystal Si. A trench T is formed by etching a portion of the semiconductor substrate 1a. A trench type isolation layer 2 that will serve as a polishing stopper layer is formed by filling the trench T with an oxide layer. At this time, the trench T is formed having a slope of 83~85° to provide a top rounding effect for restraining formation of the characteristic hump topography and a bottom rounding effect for improving junction leakage current, thereby obtaining improved device characteristics. A first oxide layer 3a is formed on the isolation layer 2 and the semiconductor substrate 1a.

Referring to FIG. 1B, a base substrate 4 is prepared and a second oxide layer 3b is formed on the base substrate 4. The base substrate 4 and the semiconductor substrate 1 are bonded to contact the first oxide layer 3a with the second oxide layer 3b. A semiconductor layer 1a is formed by polishing the semiconductor substrate with a Chemical Mechanical Polishing (hereinafter, CMP) process using the isolation layer 2 as the polishing stopper, thereby forming a SOI wafer having a stack structure of the base substrate 1, a buried oxide layer 3 comprising the first and second oxide layers 3a and 3b, and the semiconductor layer having the isolation layer 2.

However, the method of fabricating the SOI wafer according to the prior art is incapable of obtaining the most desirable device characteristics for the following reasons.

First, when forming the isolation layer 2, the trench T has the slope of 83~85° to secure good device characteristics. However, the trench T is incapable of obtaining the good device characteristic since the upper and lower portions thereof are reversed during subsequent processing.

Second, the characteristics of devices integrated in the SOI wafer largely depend on the thickness uniformity of the semiconductor layer 1a. The polishing of the semiconductor substrate using the isolation layer as the polishing stopper, as shown in FIG. 1B, generates a dishing D on the surface of the semiconductor layer. This dishing is due to the difference in polishing removal rates between the Si and the oxide layers which can be characterized by a selectivity ratio, thereby degrading the thickness uniformity of the semiconductor layer 1a. Consequently, good device characteristics can not be obtained.

SUMMARY OF THE INVENTION

It is an object of the present invention to provide a method of fabricating a SOI wafer capable of providing improved device characteristics.

To accomplish the above-mentioned object, the present invention provides a method of fabricating a SOI wafer, comprising: preparing a semiconductor substrate and a base substrate; forming a pad oxide layer, a nitride layer, and a mask oxide layer in sequence on one surface of the semiconductor substrate; etching the pad oxide layer, the nitride layer and the mask oxide layer to expose an isolation region of the semiconductor substrate; etching the exposed semiconductor substrate region to form a trench; removing the mask oxide layer; field-oxidizing the low surface of the trench to form a field oxide layer having bird's-beak at the edge thereof; removing the field oxide layer; burying the oxide layer into the trench to form a trench type isolation layer; removing the nitride layer and the pad oxide layer; depositing a first insulating layer on the isolation layer and the semiconductor substrate; depositing a second insulating layer on the base substrate; bonding the semiconductor substrate and the base substrate to contact the first insulating layer with the second insulating layer; initially polishing the surface of the semiconductor substrate using the isolation layer as a polishing stopper; and subsequently polishing surface of the semiconductor substrate to form a semiconductor layer of a desired thickness.

BRIEF DESCRIPTION OF THE DRAWINGS

The objects and advantages of the present invention can be easily understood with reference to the following detailed description and the attached drawings.

FIGS. 2A to 2I are cross-sectional views for describing a method of fabricating a SOI wafer according the present invention.

DETAILED DESCRIPTION OF THE INVENTION

In the present invention, a method of fabricating a SOI wafer is described with reference to FIGS. 2A to 2I.

Figure 1A:
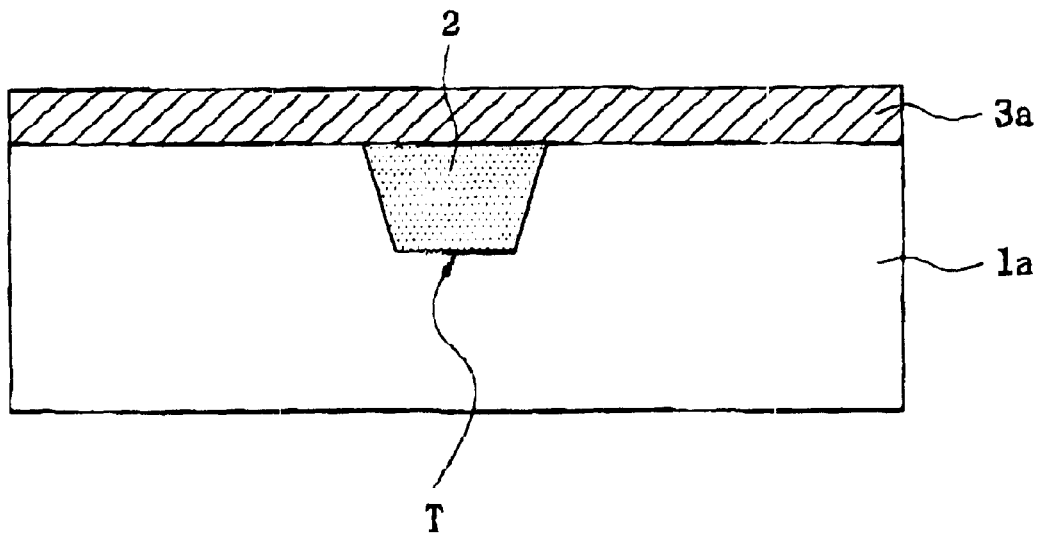
FIGS. 1A and 1B are cross-sectional views for describing a method of fabricating a SOI wafer according to the prior art.
Figure 1B:
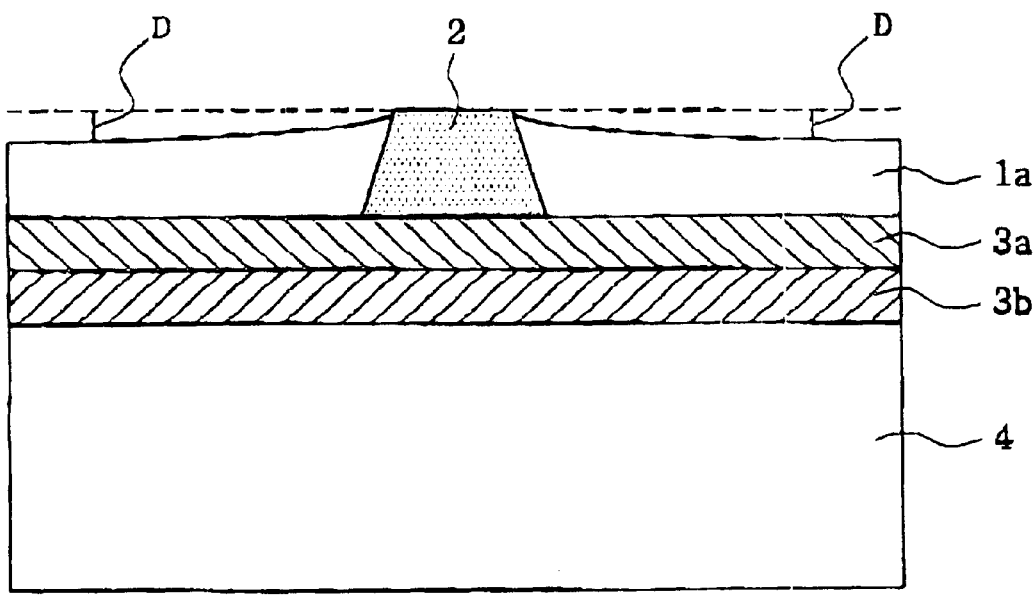
Figure 2A:
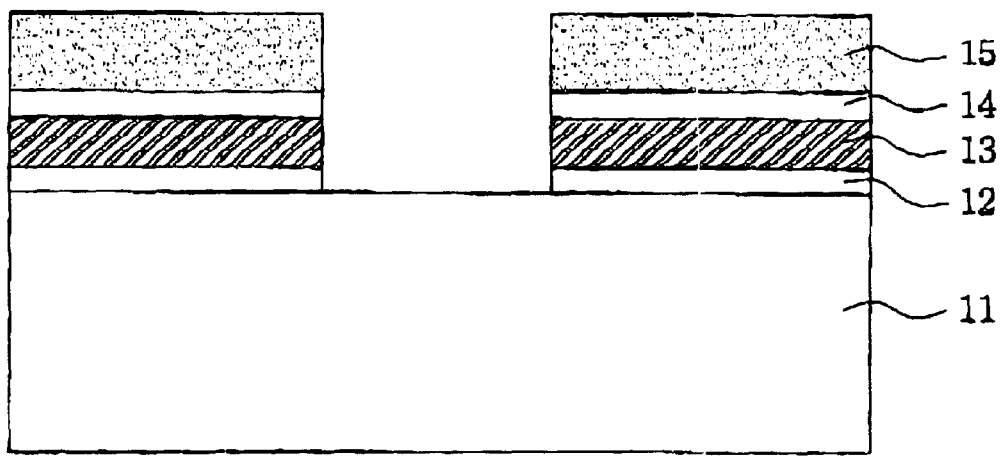

In FIG. 2A, a semiconductor substrate 11 comprising bulk Si is prepared. A pad oxide layer 12, a nitride layer 13 and a mask oxide layer 14 are sequentially deposited on one surface of the semiconductor substrate 11 to the thickness of 5~10 nm, 10~150 nm, and 30~60 nm, respectively. A photoresist layer pattern 15 is formed on the mask oxide layer 14 by a known photolithography process to define a region in which an isolation layer is formed. The mask oxide layer 14, the nitride layer 13, and the pad oxide layer 12 are etched using the photoresist layer pattern 15 as an etching barrier to expose the isolation region of the semiconductor substrate 11.

Figure 2B:
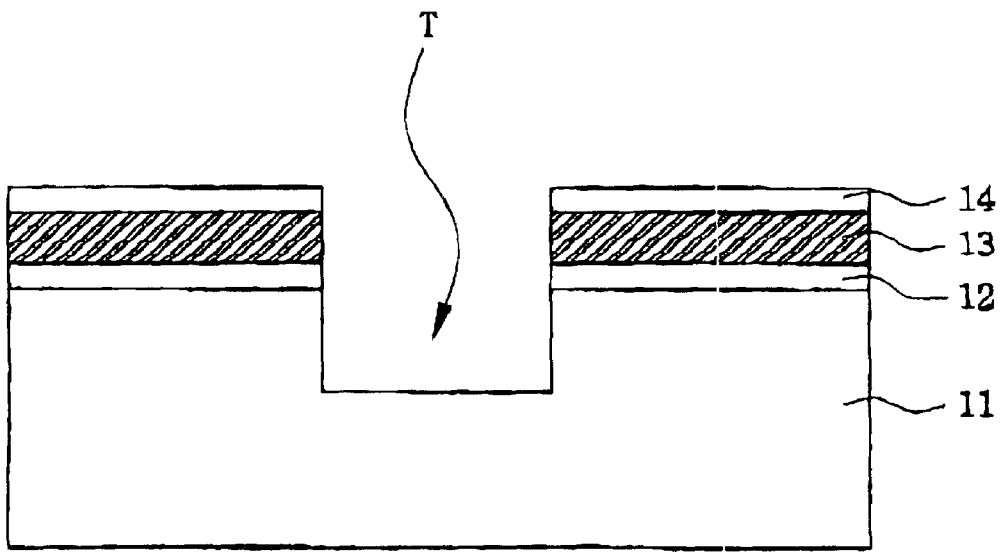

As shown in FIG. 2B, the photoresist layer pattern is then removed and a predetermined thickness of the exposed semiconductor substrate region is etched to form a trench T having a vertical slope.

Figure 2C:
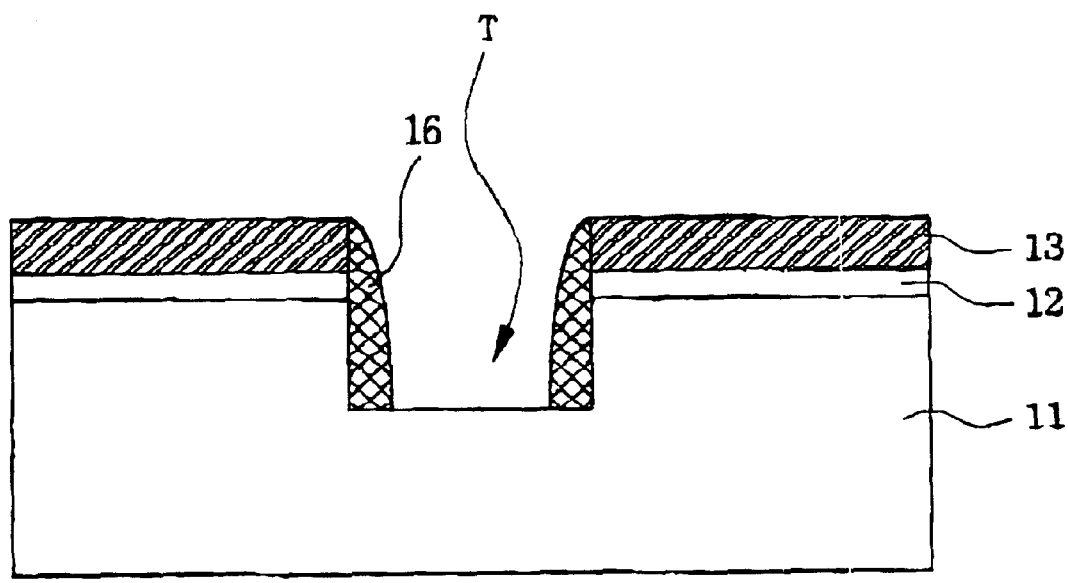

FIG. 2C illustrates that the mask oxide layer is removed followed by deposition of an oxidation preventing layer on the whole region of the substrate 11 including the trench T which is blanket-etched, thereby forming a spacer 16 on a side wall of the trench. The spacer 16 prevents the side wall of the trench T from being oxidized and is made of a polysilicon layer or nitride layer.

Figure 2D:
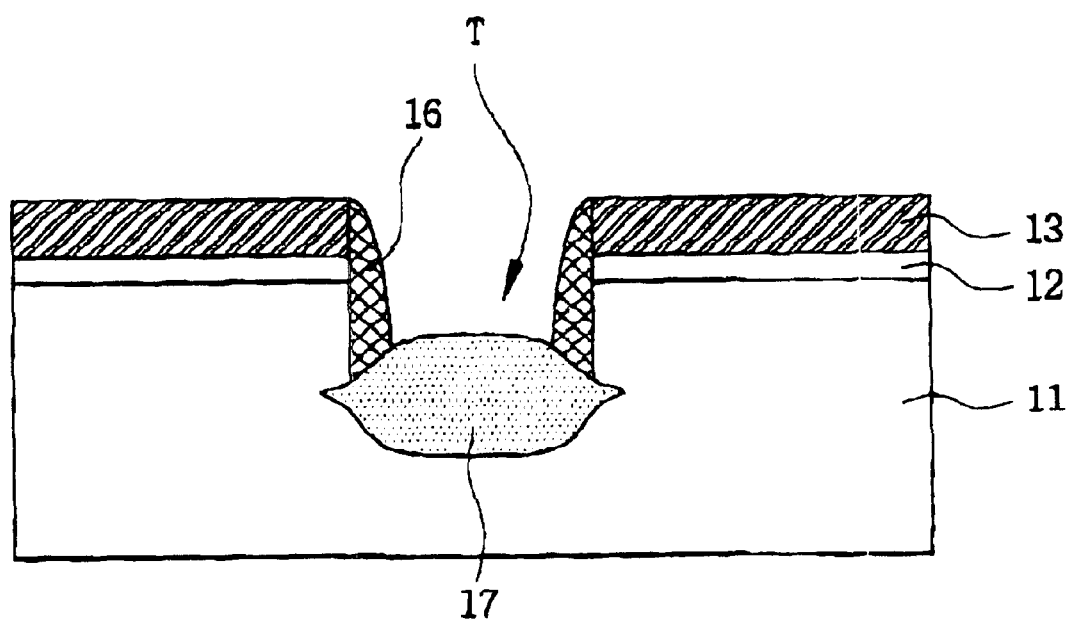

As shown in FIG. 2D, a field oxide layer having bird's-beak at the edge thereof, is formed by oxidizing the exposed trench T, using the nitride layer 13 as the oxidation preventing layer.

Figure 2E:
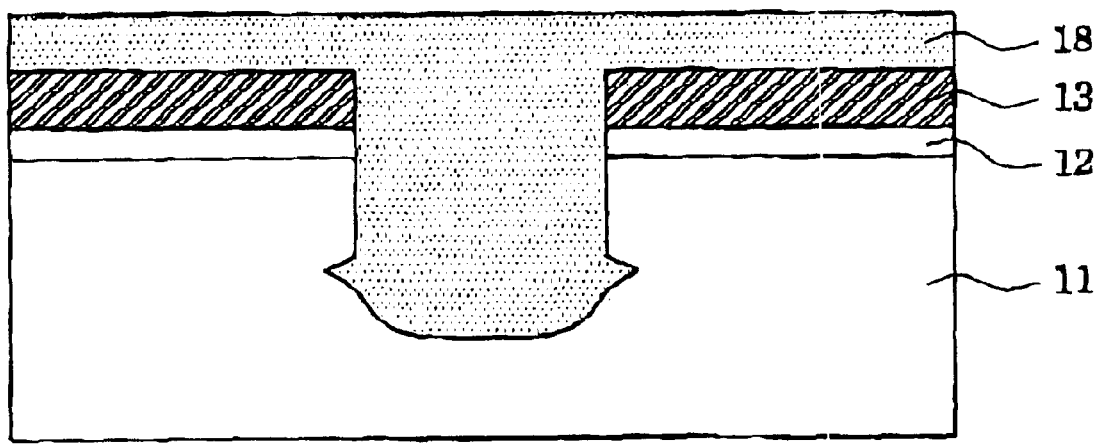

As illustrated in FIG. 2E, the field oxide layer and the spacer are removed by an etching process. An oxide layer 18 is deposited in the trench T and on the nitride layer 13 to completely fill the trench T.

Figure 2F:
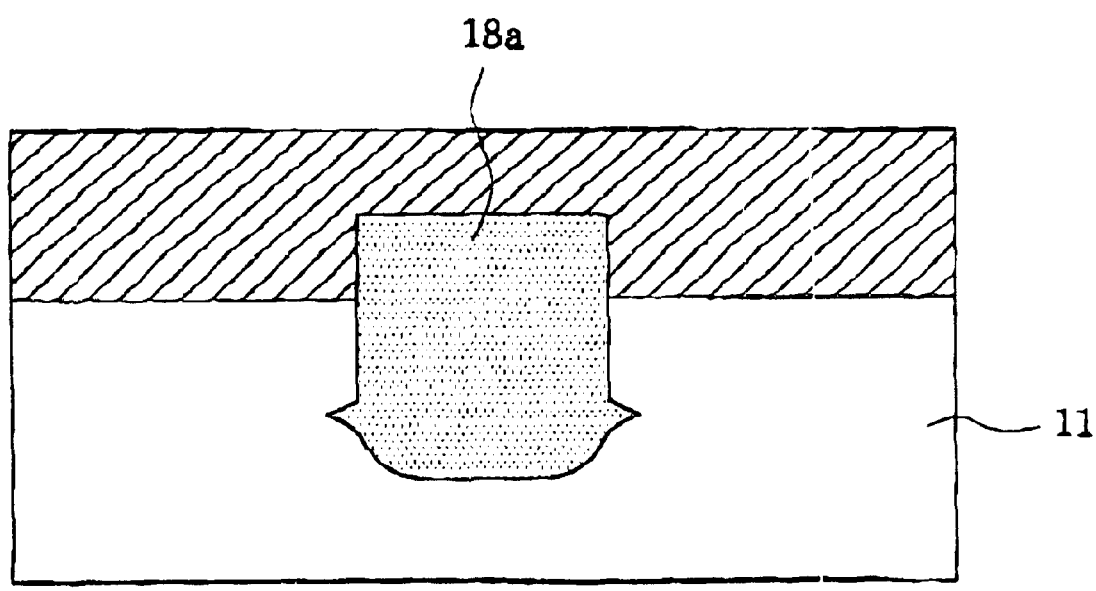

In FIG. 2F, the oxide layer is polished using a CMP process until the nitride layer is exposed, thereby forming an isolation layer 18a having bird's-beak at the lower portion thereof. The nitride layer and the pad oxide layer at the exposed low portion are removed sequentially by polishing. A first insulating layer 19a is formed on the isolation layer 18a and one surface of the semiconductor substrate 11.

Figure 2G:
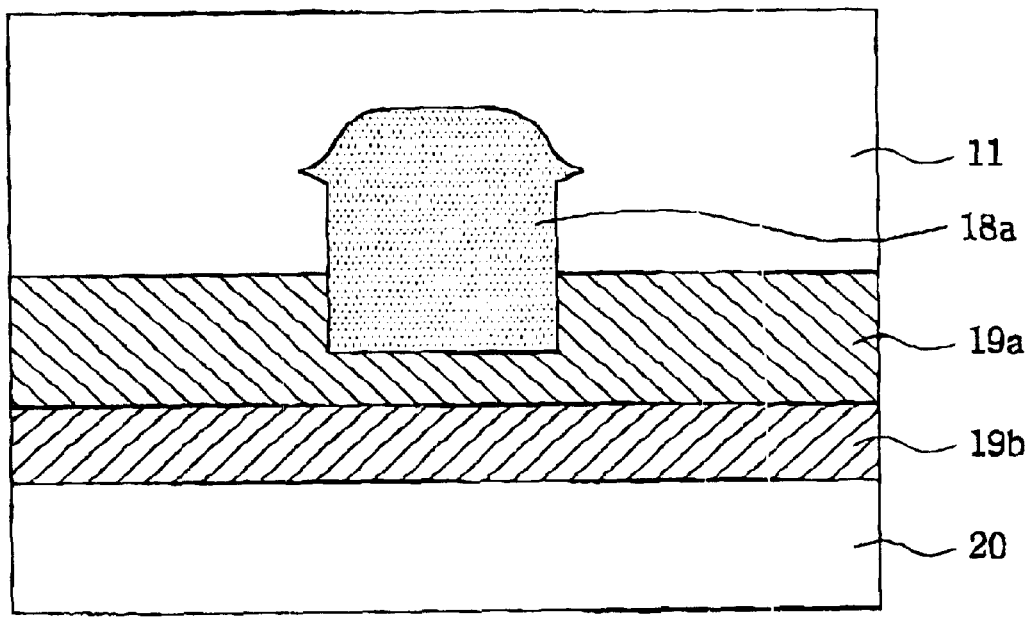

As depicted in FIG. 2G, a base substrate 20 is prepared and a second insulating layer 19b is formed on one surface of the base substrate 20. The base substrate 20 and the semiconductor substrate 11 are bonded together so that the first insulating layer 19a contacts the second insulating layer 19b. The first and second insulating layers 19a and 19b function as a buried oxide layer in the resulting SOI.

Figure 2H:
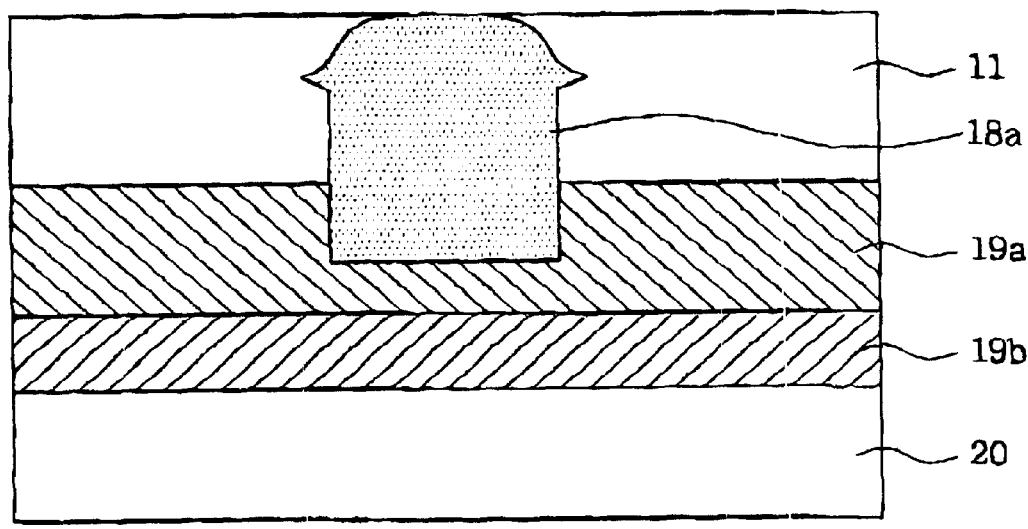
Figure 21:
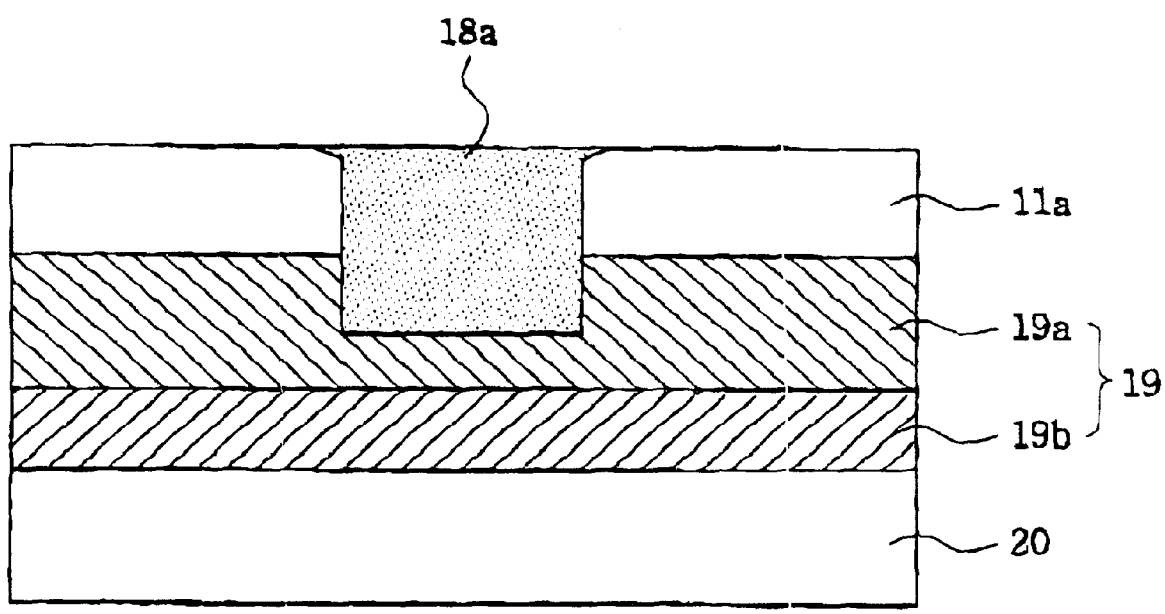

FIG. 2H shows that the surface of the semiconductor substrate 11 is first polished by a CMP process using the isolation layer 18a as a polishing stopper.

FIG. 2I illustrates that the surface of the first polished semiconductor substrate 11 is again polished using CMP to expose the portion of the bird's-beak, thereby forming a semiconductor layer 11a having the isolation layer 18a. Consequently, a SOI wafer having a stack structure of the base substrate 20, the buried oxide layer 19, and the semiconductor layer 11a may be fabricated. The second polishing step is performed using a slurry in which the polishing removal rate ratio for the Si layer and the oxide layer is 1:1. The duration of the second CMP polishing step is controlled to produce a semiconductor layer of a desired thickness.

By processing the wafer according to the present invention, a top rounding effect is obtained for the upper portion of the isolation layer 18a, due to bird's-beak, thereby suppressing a deterioration and a hump characteristic of a subsequent gate oxide layer. Furthermore, the dishing in the semiconductor layer is minimized by using the slurry in which the polishing selective ratio of the Si layer and the oxide layer is 1:1, and by the bird's-beak provided on the isolation layer.

Accordingly, the present invention semiconductor device is integrated in a SOI wafer fabricated with the advantage of restraining deterioration and hump characteristics of a gate oxide layer and increasing the thickness uniformity of a semiconductor layer, thereby obtaining improved device characteristics. Furthermore, the reliability of the subsequent process can be increased due to the improvement in the thickness uniformity of the semiconductor layer.

Various other modifications will be apparent to and can be readily made by those skilled in the art without departing from the scope and spirit of the present invention.

What is claimed is:

1. A method of fabricating a SOI wafer, comprising the steps of:

preparing a semiconductor substrate and a base substrate;

forming a pad oxide layer, a nitride layer and a mask oxide layer in sequence on one surface of the semiconductor substrate;

etching the pad oxide layer, the nitride layer and a mask oxide layer to expose an isolation region of the semiconductor substrate;

forming a trench by etching the exposed semiconductor substrate region;

removing the mask oxide layer;

forming a spacer for preventing oxidation on the side wall of the trench;

forming a field oxide layer in the isolation region having bird's-beak at the edge thereof by oxidizing the low surface of the trench using the spacer and the nitride layer as the oxidation preventing layer;

removing the field oxide layer;

filling the trench with oxide to form a trench type isolation layer;

removing the nitride layer and the pad oxide layer;

depositing a first insulating layer on the isolation layer and the semiconductor substrate;

depositing a second insulating layer on the base substrate;

bonding the semiconductor substrate and the base substrate to contact the first insulating layer with the second insulating layer;

polishing the surface of the semiconductor substrate using the isolation layer as a polishing stopper; and further polishing the surface of the semiconductor substrate to expose the bird's beak, thereby forming a semiconductor layer of a desired thickness.

2. The method as claimed in claim 1, wherein the pad oxide layer is deposited to the thickness of 5~10 nm.

3. The method as claimed in claim 1, wherein the pad nitride layer is deposited to the thickness of 100~150 nm.

4. The method as claimed in claim 1, wherein the mask oxide layer is deposited to the thickness of 30~60 nm.

5. The method as claimed in claim 1, wherein the trench is formed with substantially vertical sidewalls.

6. The method as claimed in claim 1, wherein the spacer is made of a polysilicon layer or a nitride layer.

7. The method as claimed in claim 1, wherein the further polishing step is performed using a slurry for which the ratio of the removal rates for the Si layer and the oxide layer is 1:1.

* * * * *